United States Patent [19]

Takagi

[11] Patent Number: 5,665,521
[45] Date of Patent: Sep. 9, 1997

[54] LITHOGRAPHIC ELEMENT COMPRISING SUPPORT AND HYDROPHILIC LAYER

[75] Inventor: Yoshihiro Takagi, Kanagawa, Japan

[73] Assignee: Fuji Photo Film Co., Ltd., Kanagawa, Japan

[21] Appl. No.: 591,409

[22] Filed: Jan. 25, 1996

[30] Foreign Application Priority Data

Jan. 25, 1995 [JP] Japan .................... 7-009714

[51] Int. Cl.$^6$ .................... G03F 7/11
[52] U.S. Cl. .................... 430/272.1; 430/302
[58] Field of Search .................... 430/302, 272.1, 430/272

[56] References Cited

U.S. PATENT DOCUMENTS 4,606,985  8/1986  Takaya et al. .................... 430/302 X

FOREIGN PATENT DOCUMENTS

619524A1  10/1994  European Pat. Off. .................... 430/302

OTHER PUBLICATIONS

Okamoto et al, Chemical Abstracts 120:311530 of "Photopolymerizable composition", an abstract of Japanese Kokai Tokkyo Koho Jp 05142772 A2 published Jun. 11, 1993 Jun. 11, 1991.

Fuji Photo, 93-2211486 from Wpids file from Derwent Information Ltd, an abstract of Japanese Kokai Tokkyo Koho Jp 05142772 A2 published Jun. 11, 1993. Japanese patent application Jp 05142772 A2 published Jun. 11, 1993 Jun. 11, 1991.

L. Wettling, *Research Disclosure*, No. 141, pp. 10–12, Jan. 1976.

*Primary Examiner*—Cynthia Hamilton
*Attorney, Agent, or Firm*—Birch, Stewart, Kolasch & Birch, LLP

[57] ABSTRACT

A lithographic element comprises a support and a hydrophilic layer. The hydrophilic layer contains fine particles of silicon dioxide dispersed in gelatin. The particles have an average particle size in the range of 0.1 to 10 μm. The particles are contained in the layer in an amount of not more than 2 g per m$^2$. The gelatin has an average molecular weight in the range of 10,000 to 300,000.

10 Claims, No Drawings

LITHOGRAPHIC ELEMENT COMPRISING SUPPORT AND HYDROPHILIC LAYER

FIELD OF THE INVENTION

The present invention relates to a lithographic element comprising a support and a hydrophilic layer, which can be used in offset printing.

BACKGROUND OF THE INVENTION

A presensitized lithographic plate usually comprises a support, a hydrophilic layer and a light-sensitive layer in that order.

As computer technology has been recently developed, a great technical innovation has been introduced into printing. The field of color printing is now digitized by using a computer system called CEPS (Color Electronic Prepress System). The CEPS digitizes the printing data of a color image and the data of all the prepress process. Further, the newest system directly outputs the digitized printing data to a presensitized lithographic plate of a high sensitivity to prepare a lithographic plate without use of a conventional lith film. The lithographic plate for the system is called DDPP (Digital Direct Printing Plate).

A presensitized DDPP is exposed to light corresponding to the digitized data. The exposure step is preferably conducted in commercially available printing machines such as an image setter or a scanner (e.g., SG757 and SG608 of Dai Nippon Printing Co., Ltd.; Select Set™ and Accuset™ of Agfa; Lino™ 300 of Lino; and Magna™ 646 of Crossfield). In the image setter or the scanner, a flexible.(e.g., plastic or paper) support of a plate is preferred to a hard (e.g., aluminum) support.

According to a lithographic process, the unhardened (unexposed) area of a light-sensitive layer is removed from the support. A hydrophilic layer is arranged between the support and the light-sensitive layer to form an ink-repulsive surface. The hydrophilic layer usually contains solid particles dispersed in a hydrophilic binder. The solid particles form a rough surface on the hydrophilic undercoating layer. The rough surface can contain dampening water when the plate is used in printing.

The components of a light-sensitive layer are determined depending on the lithographic method. For example, a light-sensitive layer for a photopolymerization method may contain a photopolymerization initiator and an ethylenically unsaturated polymerizable compound or a cross-linkable polymer, as is described in U.S. Pat. Nos. 2,927,022, 2,902,356 and 3,870,524. Further, the light-sensitive layer may comprise a silver halide emulsion layer and a physical development nucleation layer according to a silver complex salt diffusion transfer method. A presensitized plate for the silver complex salt diffusion transfer method is commercially available (e.g., Silver Digiplate™ of Mitsubishi Paper Mills Co., Ltd.; and Set Print™ of Agfa).

SUMMARY OF THE INVENTION

The applicant notes a problem in the conventional lithographic element comprising a support and a hydrophilic layer. A stain is observed in the background of a printed image formed by using the conventional lithographic element. According to the study by the applicant, the problem can be solved by improving the hydrophilic layer of the element.

An object of the present invention is to provide a lithographic element that forms a clear image in which a stain is scarcely observed in the background.

Another object of the invention is to provide a lithographic element having a high sensitivity.

The present invention provides a lithographic element which comprises a support and a hydrophilic layer, wherein the hydrophilic layer contains fine particles of silicon dioxide dispersed in gelatin, said particles having an average particle size in the range of 0.1 to 10 µm, said particles being contained in the layer in an amount of not more than 2 g per $m^2$, and said gelatin having an average molecular weight in the range of 10,000 to 300,000.

The invention also provides a lithographic element which comprises a support, a hydrophilic layer and a light-sensitive layer in that order, wherein the hydrophilic layer contains fine particles of silicon dioxide dispersed in gelatin, said particles having an average particle size in the range of 0.1 to 10 µm, said particles being contained in the layer in an amount of not more than 2 g per $m^2$, and said gelatin having an average molecular weight in the range of 10,000 to 300,000, and wherein the light-sensitive layer contains a photopolymerization initiator and an ethylenically unsaturated polymerizable compound or a cross-linkable polymer.

The invention further provides a process for the preparation of a lithographic plate comprising the steps of:

imagewise exposing to light a lithographic element which comprises a support, a hydrophilic layer and a light-sensitive layer in that order to form a hardened area and an unhardened area in the light-sensitive layer, wherein the hydrophilic layer contains fine particles of silicon dioxide dispersed in gelatin, said particles having an average particle size in the range of 0.1 to 10 µm, said particles being contained in the layer in an amount of not more than 2 g per $m^2$, and said gelatin having an average molecular weight in the range of 10,000 to 300,000, and wherein the light-sensitive layer contains a photopolymerization initiator and an ethylenically unsaturated polymerizable compound or a cross-linkable polymer; and removing the unhardened area of the light-sensitive layer.

DETAILED DESCRIPTION OF THE INVENTION

Silicon Dioxide Particles

The silicon dioxide particles have an average particle size in the range of 0.1 to 10 µm. The average particle size is preferably larger than the thickness of the undercoating layer. Two or more kinds of particles having different average particle sizes can be used in combination. Further, very small particles having an average particle size of smaller than 0.05 µm (such as colloidal silica particles) can be used in combination of the silicon dioxide particles of the present invention.

The silicon dioxide particles preferably have such a surface area that the surface of the particles can absorb an oil in an amount of not less than 200 mg per 1 g of the particles.

The silicon dioxide particles are contained in the hydrophilic layer in an amount of not more than 2 g per $m^2$, preferably in an amount of 0.1 to 2 g per $m^2$. The amount of the particles is preferably in the range of 10 to 300 wt. % based on the amount of gelatin (described below). The amount of the colloidal silica is preferably in the range of 10 to 300 wt. % based on the amount of silicon dioxide particles.

Gelatin

The hydrophilic layer contains gelatin as a binder. A gelatin derivative can be used as the gelatin. Gelatin has an average molecular weight in the rnage of 10,000 to 300,000.

Gelatin may have a cross-linked structure. The crosslinked structure is preferably formed by a reaction of gelatin with a hardening agent. Examples of the hardening agents include inorganic substances (e.g., chrome alum), aldehydes (e.g., formaldehyde, glyoxal, malealdehyde, glutaraldehyde, mucochloric acid), N-methylol compounds (e.g., urea, ethylene urea), cyclic ether compounds (e.g., 2,3-dihydroxy-1,4-dioxane), active halogen compounds (e.g., 2,4-dichloro-6-hydroxy-S-triazine salt, 2,4-dihydroxy-6-chlorotriazine salt), active vinyl compounds (e.g., divinylsulfone, divinyl ketone), compounds having two or more active three-membered rings (such as ethyleneimino ring and epoxy ring) and polymers (e.g., dialdehyde starch). Two or more hardening agents can be used in combination.

Gelatin is preferably contained in the hydrophilic layer in an amount of 0.1 to 6.0 g per m$^2$.

Hydrophilic Layer

The hydrophilic layer is provided between a support and a light-sensitive layer.

The hydrophilic layer may contain pigment particles (e.g., carbon black), solid dispersions of dyes and water-soluble dyes in addition to the silicon dioxide particles and gelatin. The hydrophilic layer containing pigments or dyes can function as an antihalation layer.

The hydrophilic layer preferably has a thickness in the range of 0.1 to 5 μm, and more preferably in the range of 0.2 to 4 μm.

The hydrophilic layer is formed by coating a solution containing the above-mentioned components on a support and drying the coated layer. The hydrophilic layer is dried preferably at a temperature in the range of 70 to 140° C.

Intervening Layer

An intervening layer may be provided between the hydrophilic layer and a light-sensitive layer. The intervening layer contains a hydrophilic binder. Gelatin is preferably used as the hydrophilic binder.

The intervening layer also may contain solid particles (such as silicon dioxide). The particles preferably have an average particle size in the range of 0.1 to 5 μm. The average particle size is preferably smaller than the size of the silicon di oxide particles contained in the hydrophilic layer.

The intervening layer may further contain very small particles having an average particle size of smaller than 0.05 μm (such as colloidal silica particles).

The weight ratio of the solid particles to the hydrophilic binder in the intervening layer is preferably in the range of ¹⁄₁₀ to ¹⁰⁄₁. The ratio of the particles to the binder in the intervening layer is preferably larger than the corresponding ratio in the hydrophilic layer.

The intervening layer has a thickness preferably in the range of 0.1 to 5 μm.

Support

A plastic or paper support is preferably used in the present invention.

The plastic support is made of a plastic polymer. Examples of the plastic polymers include cellulose ester (e.g., cellulose diacetate, cellulose triacetate, cellulose propionate, cellulose acetate butyrate, cellulose nitrate), polyester (e.g., polyethylene terephthalate, polybutylene terephthalate, polyethylene naphthalate), polyethylene, polystyrene (which preferably has a syndiotactic structure), polypropylene, polycarbonate, polyvinyl acetal, polyimide, polybenzimidazole, polyether ketone, polyphenylene sulfide, polyamide (e.g., aramid), polysulfone, polyallylate and polyether sulfone. Polyethylene terephthalate and polyethylene naphthalate are particularly preferred.

The paper support is preferably made of a waterproof paper, which is made by coating a waterproof agent on a paper orby laminating polyethylene on a paper.

The support preferably has a thickness in the range of 75 to 350 μm, and more preferably has a thickness in the range of 95 to 300 μm.

Light-Sensitive Layer

The components of a light-sensitive layer are determined by depending on a lithographic method. The lithographic element of the present invention can be used in various lithographic methods such as a method using a photopolymerization initiator as a photosensor (photopolymerization method) and a silver complex salt diffusion transfer method. The element of the invention can be advantageously used in the photopolymerization method. The light-sensitive layer for the photopolymerization method is described below in more detail. The light-sensitive layer contains a photopolymerization initiator and an ethylenically unsaturated polymerizable compound or a cross-linkable polymer.

Photopolymerization Initiator

Examples of the photopolymerization initiators include carbonyl compounds, halogen-containing compounds, photo-reducible dyes and redox couples of dyes and initiators.

Examples of the carbonyl compounds include benzyl compounds, benzoin compounds, benzoin ethers, Michler's ketone, anthraquinone, acridine, phenazine, benzophenone, 2-ethylanthraquinone and ketoxime esters. Examples of the ketoxime esters include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluene-sulfonyloxyiminobutan-2-one and 2-ethoxycarbonyloxyimino-1-phenylpropan-1-one.

Examples of the halogen-containing compounds are trihalomethyltriazine compounds. Examples of the photoreducible dyes include rose bengal, eosin and erythrosine (U.S. Pat. No. 2,850,445).

Examples of the initiators in the redox couples include amines (Japanese Patent Publication No. 44(1969)-20189), combinations of hexaarylbiimidazoles and radical initiators (japanese Patent Publication No. 45(1970)-37377), combinations of hexaarylbiimidazoles and p-dialkylaminobenzilidene ketones (Japanese Patent Publication No. 47(1972)-2528 and Japanese Patent Provisional Publication No. 54(1979)-155292), organic peroxides (Japanese Patent Publication No. 62(1987)-1641, Japanese Patent Provisional Publication Nos. 59(1984)-1504, 59(1984)-140203, 59(1984)189340, 62(1987)-174203, U.S. Pat. No. 4,766,055), active halogen compounds (Japanese Patent Provisional Publication Nos. 54(1979)-15102, 58(1983)-15503, 63(1988)-178105, 63(1988)-258903, No. 2(1990)-63054) and borate compounds (Japanese Patent Provisional Publication Nos. 62(1987)143044, 62(1987)-150242, 64(1989)-13140, 64(1989)-13141, 64(1989)-13142, 64(1989)-13143, 64(1989)-13144, 64(1989)17048, 64(1989)-72150, 1(1989)-138204, 1(1989)-229003, 1(1989)-298348, 2(1990)-179643, 2(1990)-244050).

Examples of the hexaarylbiimidazoles include 2,2'-bis(o-chlorophenyl)-4,4',5,5-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)

biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The amount of the photopolymerization initiator (including a sulfur compound described below) is preferably in the range of 0.01 to 60 wt. %, and more preferably in the range of 1 to 30 wt. % based on the amount of the polymerizable compound and a cross-linkable polymer (including a polymer containing removable hydrogen described below).

Polymerizable Compound

The polymerizable compound used in the present invention has an ethylenically unsaturated group. The compound preferably has two or more ethylenically unsaturated groups.

The compound may be in the form of a monomer or a prepolymer, namely a dimer, a trimer and an oligomer. A copolymer of the monomers and a mixture thereof can also be used as the polymerizable compound.

Examples of the ethylenically unsaturated polymerizable compounds include esters of aliphatic polyhydric alcohols with unsaturated carboxylic acids (e.g., acrylic acid, methacrylic acid, itaconic acid, crotonic acid, isocrotonic acid, maleic acid) amides of aliphatic polyamines with the unsaturated carboxylic acids.

Examples of the acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers.

Examples of the methacrylic esters include tetramethylene glycol dimethacrylate, triethylene glycol, dimethacrylate, neopentyl glycol dimethacrylate, trimethylolpropane trimethacrylate, trimethylolethane triacrylate, ethylene glycol dimethacrylate, 1,3-butanediol dimethacrylate, hexanediol dimethacrylate, pentaerythrytol dimethacrylate, pentaerythrytol trimethacrylate, pentaerythrytol tetramethacrylate, dipentaerythrytol dimethacrylate, dipentaerythrytol hexamethacrylate, sorbitol trimethacrylate, sorbitol tetramethacrylate, bis[p-(3-methacryloxy-2-hydroxypropoxy)phenyl]dimethylmethane and bis[p-(acryloxyethoxy)phenyl]dimethylmethane.

Examples of the iraconic esters include ethylene glycol diitaconate, propylene glycol diitaconate, 1,3-butanediol diitaconate, 1,4-butanediol diitaconate, tetramethylene glycol diitaconate, pentaerythrytol diitaconate and sorbitol tetraitaconate.

Examples of the crotonic esters include ethylene glycol dicrotonate, tetramethylene glycol dicrotonate, pentaerythrytol dicrotonate and sorbitol tetracrotonate.

Examples of the isocrotonic esters include ethylene glycol diisocrotonate, pentaerythrytol diisocrotonate and sorbitol tetraisocrotonate.

Examples of the maleic esters include ethylene glycol dimaleate, triethylene glycol dimaleate, pentaerythrytol dimaleate and sorbitol tetramaleate.

Examples of the amides include methylene bis-acrylamide, methylene bis-methacrylamide, 1,6-hexamethylene bisacrylamide, 1,6-hexamethylene bis-methacrylamide, diethylenetriamine tris-acrylamide, xylylene bis-acrylamide and xylylene bis-methacrylamide.

Further, vinyl urethane compounds having two or more polymerizable vinyl groups can be used as the polymerizable compound. The urethane compounds can be obtained by adding hydroxyvinyl monomers represented by the formula (A) to polyisocyanates (disclosed in Japanese Patent Provisional Publication No. 48(1973)-41708).

$$CH_2=C(R)COOCH_2CH(R')OH \quad (A)$$

wherein each of R and R' means H or $CH_3$.

Furthermore, examples of other polymerizable compounds include urethane acrylates (Japanese Patent Provisional Publication No. 51(1976)-37193), polyester acrylates (Japanese Patent Provisional Publication No. 48(1973)-64183 and Japanese Patent Publication Nos. 49(1974)-43191, 52(1977)-30490) and epoxy (meth)acrylates (obtained by reactions of epoxy resins with (meth)acrylic acids). The other polymerizable compounds (photo-curable monomers and oligomers) are described in Japan Adhesive Society (written in Japanese), Vol. 20, No. 7, pages 300 to 308 (1984).

The amount of the polymerizable compound is preferably in the range of 5 to 50 wt. %, and more preferably in the range of 10 to 40 wt. % based on the total amount of the light-sensitive layer.

Cross-Linkable Polymer

The light-sensitive layer preferably contains a crosslinkable polymer. The polymer is preferably miscible with the polymerizable compound. The polymer also preferably has a linear (not cross-linked) structure.

The cross-linkable polymer is preferably dissolved or swelled in water or a weak alkaline developing solution. If the polymer is soluble in water, the lithographic plate can be developed with water. Examples of water-soluble polymers are addition polymers having carboxylic groups in their side chains, such as methacrylic acid copolymers, acrylic acid copolymers, itaconic acid copolymers, crotonic acid copolymers, maleic acid copolymers and partially esterified maleic acid copolymers. The polymers are described in Japanese Patent Provisional Publication Nos. 54(1979)-92723, 59(1984)-44615, 59(1984)-53836, 59(1984)71048, Japanese Patent Publication Nos. 54(1979)-25957, 54(1979)-34327 and 58(1984)-12577.

The other examples of the polymers include acidic cellulose derivatives having carboxylic groups in their side chains, polyvinyl pyrrolidone and polyethylene oxide. Benzyl (meth)acrylate/(meth)acrylic acid copolymers and allyl (meth)acrylate/(meth)acrylic acid copolymers are preferred. The copolymers may have another repeating unit. A polyamide soluble in alcohol or a polyether of 2,2-bis(4-hydroxyphenyl)propane with epichlorohydrin can also be used to improve the mechanical strength of the light-sensitive layer.

The polymer preferably has a group containing hydrogen that is removable by attack of sulfur radical. The group may be attached to the main chain or the side chain of the polymer. Hydrogen is preferably removable from the group easier than from methyl of toluene. Examples of the hydrogen removable groups are shown below.

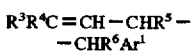  (1)
—CHR⁶Ar¹  (2)

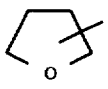  (3)

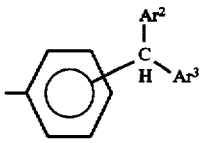  (4)

wherein each $R^3$, $R^4$, $R^5$ and $R^6$ independently is hydrogen, an alkyl group, an alkenyl group, an aryl group or a substituted aryl group; and each of $Ar^1$, $Ar^2$ and $Ar^3$ independently is an aryl group or a substituted aryl group.

The cross-linkable polymer is contained in the light-sensitive layer preferably in an amount of not more than 90 wt. %, and more preferably in the range of 30 to 85 wt. % based on the total amount of the light-sensitive layer. The weight ratio of the ethylenically unsaturated polymerizable compound to the cross-linkable polymer is preferably in the range of 1/9 to 7/3, and more preferably in the range of 3/7 to 5/5.

Sulfur Compound

The sulfur compound is preferably represented by the formula (Ia) or (Ib).

  (Ia)

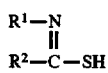  (Ib)

wherein $R^1$ is an alkyl group, an aryl group or a substituted aryl group; $R^2$ is hydrogen or an alkyl group; or $R^1$ and $R^2$ are combined with each other to form a five to seven membered ring. The ring may contain a hetero atom selected from the group consisting of oxygen, sulfur and nitrogen.

The alkyl group preferably has 1 to 4 carbon atoms. The aryl group preferably has 6 to 10 carbon atoms. Examples of the aryl groups include phenyl and naphthyl. The aryl group may be substituted with a halogen atom (e.g., chlorine), an alkyl group (e.g., methyl) or an alkoxy group (e.g., methoxy, ethoxy).

Examples of the sulfur compounds are shown below. In the compounds Nos 15 to 43, $R^1$ and $R^2$ are combined with each other to form a ring. With respect to Nos. 15 to 43, the combinations of $R^1$ and $R^2$ are shown below.

| No. | $R^1$ | $R^2$ |
|---|---|---|
| 1 | —H | —H |
| 2 | —H | —CH₃ |
| 3 | —CH₃ | —H |
| 4 | —CH₃ | —CH₃ |
| 5 | —C₆H₅ | —C₂H₅ |
| 6 | —C₆H₅ | —C₄H₉ |
| 7 | —C₆H₄Cl | —CH₃ |
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₃— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O | |
| 24 | —CH=CH—N(CH₃)— | |
| 25 | —(CH₂)₃—S— | |
| 26 | —(CH₂)₂CH(CH₃)—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |

(Structures 32–42 shown as diagrams)

Other Additives

The light-sensitive layer may contain a thermal polymerization inhibitor, which has a function of preventing a thermal polymerization while preparing or storing the lithographic element. Examples of the polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2,2'-methylenebis(4-methyl-6-t-butylphenol) and cerium(III) N-nitrosophenylhydroxyamine. The amount of the thermal polymerization inhibitor is preferably in the range of 0.01 to 5 wt. % based on the total amount of the light-sensitive layer.

A higher fatty acid or its derivative may be added to the light-sensitive layer to prevent the function of oxygen in the air. Oxygen functions as a polymerization inhibitor. An example of the fatty acid is behenic acid. An example of the fatty acid derivative is behenic amide. The higher fatty acid or its derivative preferably is arranged in the surface of the light-sensitive layer. The amount of the fatty acid or its derivative is preferably in the range of 0.5 to 10 wt. % based on the total amount of the light-sensitive layer.

A dye or pigment can be contained in the light-sensitive layer. The amount of the dye or pigment is preferably in the range of 0.5 to 5 wt. % based on the total amount of the light-sensitive layer.

The light-sensitive layer may further contain an inorganic filler, which improves the physical properties of the hardened layer.

Coating Solution for Light-Sensitive Layer

The coating solution for the light-sensitive layer is prepared by dissolving, dispersing or emulsifying the above-mentioned components in an organic solvent.

Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethylether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate and ethyl lactate. Two or more solvents can be used in combination.

The solid content in the coating solution is preferably in the range of 2 to 50 wt. %.

The dry coated amount of the light-sensitive layer is preferably in the range of 0.1 to 10 g/m², and more preferably in the range of 0.5 to 5 g/m².

Overcoating Layer

An overcoating (protective) layer may be provided on the light-sensitive layer. The overcoating layer has a function of preventing oxygen in the air from permeating into the light-sensitive layer. The overcoating layer preferably contains a polyvinyl alcohol having a high saponification degree (99% or more) or an acidic cellulose, which has an excellent function of preventing oxygen. The overcoating layer is described in U.S. Pat. No. 3,458,311 and Japanese Patent Publication No. 55(1980)-49729.

Exposing Step

The lithographic element of the invention is imagewise exposed to light. The wavelength of the light is usually within the visible or ultraviolet region. Examples of the light sources include an (ultrahigh, high, middle or low pressure) mercury lamp, a chemical lamp, a carbon arc lamp, a xenon lamp, a metal halide lamp, a visible or ultraviolet laser generator, a fluorescent lamp, a tungsten lamp and the sun.

Developing Step

The unhardened area of the light-sensitive layer is selectively removed by a developing solution to form a polymer image. The developing solution is described in Japanese Patent Publication No. 57(1982)-7427. The developing solution preferably is an aqueous solution of an inorganic or organic alkali agent. Examples of the inorganic alkali agents include sodium silicate, potassium silicate, sodium hydroxide, potassium hydroxide, sodium tertiary phosphate, sodium secondary phosphate, ammonium tertiary phosphate, ammonium secondary phosphate, sodium metasilicate, sodium bicarbonate and ammonium water. Examples of the organic alkali agents include monoethanolamine and diethanolamine. The concentration of the alkaline agent in the developing solution is preferably in the range of 0.1 to 10 wt. %, and more preferably in the range of 0.5 to 5 wt. %.

The aqueous solution may further contain a surface active agent or a small amount of an inorganic solvent, which is described in U.S. Pat. Nos. 3,375,171 and 3,615,480.

The developing solutions are also described in Japanese Patent Provisional Publication Nos. 50(1975)26601, 58(1983)-54341, and Japanese Patent Publication Nos. 56(1981)-39464 and 56(1981)-42860.

The obtained polymer image can be used as a printing plate or a photoresist of a print board.

EXAMPLE 1

A matting layer was provided on a back surface of a polyethylene terephthalate film having the thickness of 175 μm. The matting layer contains silicon dioxide particles having the average particle size of 5 μm.

A hydrophilic undercoating layer was provided on the other surface (on which the matting layer was not provided) of the plastic support. The hydrophilic undercoating layer contains silicon dioxide particles having the average particle size of 4.0 μm dispersed in gelatin (binder) having an average molecular weight of 100,000. The amount of the coated particles was 0.2 g/m², which was 15 wt. % based on the amount of gelatin. The thickness of the hydrophilic layer was 4.0 μm.

The following coating solution was coated on the undercoating layer, and was dried at 80° C. for 2 minutes to form a light-sensitive layer. The dry coated amount of the layer was 1.4 g/m².

| Coating solution of light-sensitive layer | |
|---|---|
| Trimethylolpropane tri(acryloyloxypropyl) ether | 2.0 g |
| Polymer (P-1, average molecular weight: 40,000) | 2.0 g |
| Photopolymerization initiator (A) | 0.13 g |
| Photopolymerization initiator (B) | 0.09 g |
| Sulfur compound (S) | 0.08 g |
| Flourine-containing nonionic surface active agent | 0.03 g |
| Methyl ethyl ketone | 20 g |
| Propylene glycol monomethyl ether acetate | 20 g |

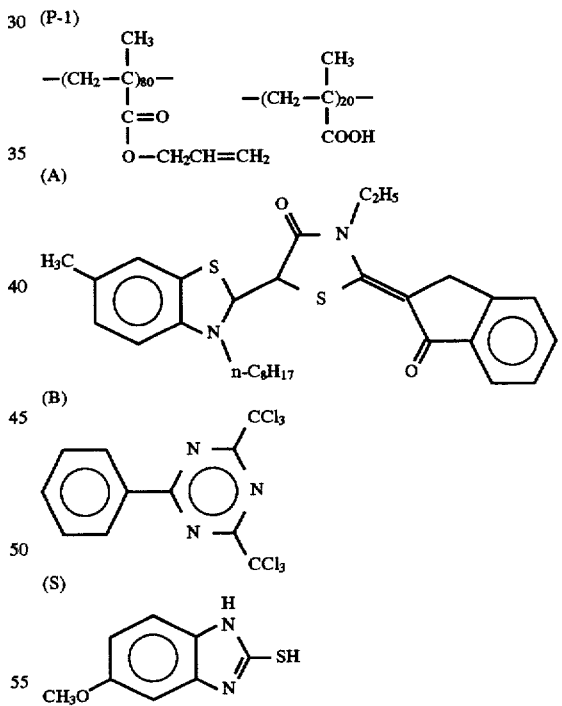

On the light-sensitive layer, 3 wt. % aqueous solution of polyvinyl alcohol (saponification degree: 86.5 to 89 mol %, polymerization degree: 1,000) was coated, and was dried at 100° C. for 2 minutes to form an overcoating layer. The dry coated amount of the layer was 2 g/m².

The obtained lithographic element (presensitized lithographic plate) was exposed to visible monochromatic light using a xenon lamp through a filter (Kenko optical filter BP-49). The lithographic element was immersed in the following developing solution at 25° C. for 1 minute.

| Developing solution | |
|---|---|
| Potassium silicate | 30 g |
| Potassium hydroxide | 15 g |
| Compound (C) | 3 g |
| Water | 1,000 g |

(C)

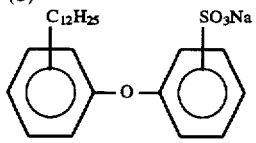

The obtained relief image was used as a printing plate in a printing machine (611 XLA-II printer of Hamada Co., Ltd.) using black or blue inks (black: Toyo Mark V Black, blue: F-Gloss 65 Ultramarine, UV black: Best Cure BF WRO black). As a result, a clear print was obtained. A stain was scarcely observed in the background of the printed image.

Further, the sensitivity of the lithographic element was evaluated by using a step tablet (PS step guide of Fuji Photo Film Co., Ltd.) having 15 steps. The optical transmission density of the first step was 0.05, and the density was stepwise increased by 0.15. The lithographic element was exposed to light through the step tablet for 120 seconds, and was treated in the same manner as is mentioned above. As a result, the 15 steps were clearly observed in the obtained image.

I claim:

1. A process for the preparation of a lithographic plate comprising the steps of:

imagewise exposing to light a lithographic element which comprises a support, a hydrophilic layer and a light-sensitive layer in that order to form a hardened area and an unhardened area in the light-sensitive layer, wherein the hydrophilic layer contains fine particles of silicon dioxide dispersed in gelatin, said particles having an average particle size in the range of 0.1 to 10 μm, said particles being contained in the layer in an amount of not more than 2 g per m$^2$, and said gelatin having an average molecular weight in the range of 10,000 to 300,000, and wherein the light-sensitive layer contains a photopolymerization initiator, a cross-linkable polymer and a sulfur compound, said cross-linkable polymer having a group containing hydrogen, and said hydrogen being removable by attack of sulfur radical; and removing the unhardened area of the light-sensitive layer.

2. The process as claimed in claim 1, wherein the hydrophilic layer further contains colloidal silica having an average particle size of not more than 0.05 μm.

3. The process as claimed in claim 2, wherein the colloidal silica is contained in the hydrophilic layer in an amount of 10 to 300 wt. % based on the amount of the fine particles.

4. The process as claimed in claim 1, wherein the fine particles are contained in the hydrophilic layer in an amount of 10 to 300 wt. % based on the amount of the gelatin.

5. The process as claimed in claim 1, wherein the hydrophilic layer is formed by coating a coating solution on the support, and drying the coated layer at a temperature in the range of 70 to 140° C.

6. The process as claimed in claim 1, wherein the support is made of polyethylene terephthalate or polyethylene naphthalate.

7. The process as claimed in claim 1, wherein the support is made of a waterproof paper made by coating a waterproof agent on a paper or by laminating polyethylene on a paper.

8. The process as claimed in claim 1, wherein the light-sensitive layer further comprises an ethylenically unsaturated polymerizable compound.

9. The process as claimed in claim 1, wherein said hydrogen-containing group on said cross-linkable polymer is selected from the group consisting of formulas (1)–(4):

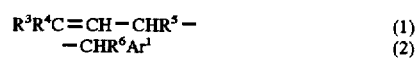 (1)

 (2)

 (3)

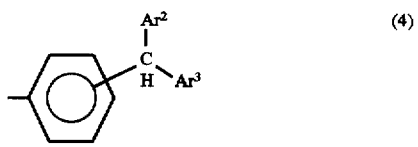 (4)

wherein R$^3$, R$^4$, R$^5$ and R$^6$ are each independently hydrogen, an alkyl group, an alkenyl group, an aryl group, or a substituted aryl group, and Ar$^1$, Ar$^2$ and Ar$^3$ are each independently an aryl group or a substituted aryl group.

10. The process as claimed in claim 1, wherein said sulfur compound is represented by the formula (Ia) or (Ib):

 (Ia)

 (Ib)

wherein R$^1$ is an alkyl group, an aryl group or a substituted aryl group; R$^2$ is hydrogen or an alkyl group; or R$^1$ and R$^2$ are combined with each other to form a five to seven membered ring.

* * * * *